United States Patent [19]
Huang

[11] Patent Number: 5,965,303
[45] Date of Patent: Oct. 12, 1999

[54] METHOD OF FABRICATING A PHASE SHIFT MASK UTILIZING A DEFECT REPAIR MACHINE

[75] Inventor: Chien-Chao Huang, Kaohsiung, Taiwan

[73] Assignee: United Microelectronics Corp., Hsin-Chu, Taiwan

[21] Appl. No.: 09/030,810

[22] Filed: Feb. 26, 1998

[30] Foreign Application Priority Data

Oct. 27, 1997 [TW] Taiwan ................................. 86115833

[51] Int. Cl.$^6$ ........................................................ G03F 9/00
[52] U.S. Cl. ................................................... 430/5; 430/22
[58] Field of Search ........................................... 430/5, 22

[56] References Cited

U.S. PATENT DOCUMENTS 5,789,116   8/1998   Kim .............................................. 430/5

OTHER PUBLICATIONS

Seiko Instruments Inc., Focused Ion Beam Mask Repair System, (12 pages).

*Primary Examiner*—Christopher G. Young
*Attorney, Agent, or Firm*—Finnegan, Henderson, Farabow, Garrett & Dunner, L.L.P.

[57] ABSTRACT

A method of fabricating a single layer phase shift mask is provided. The method is characterized by depositing an opaque layer by using a defect repair machine on a given place of the phase shift layer formed by a conventional method. The opaque layer is formed on the alignment mark. The single layer phase shift mask of the invention can provide better resolution for transferred patterns projected on the wafer and can avoid registration deviation and reduce a problem of misalignment of the alignment mark efficiently by decreasing the transmittance of the alignment mark, such as a reticule mark or a stepper mark.

17 Claims, 4 Drawing Sheets

METHOD OF FABRICATING A PHASE SHIFT MASK UTILIZING A DEFECT REPAIR MACHINE

CROSS-REFERENCE TO RELATED APPLICATION

This application claims the priority benefit of Taiwan application Ser. No. 86115833, filed Oct. 27, 1997, the full disclosure of which is incorporated herein by reference.

BACKGROUND OF THE INVENTION

1. Field of the Invention

This invention relates, in general, to the method of fabricating a phase shift mask, and, more particularly, to the method of fabricating an improved single layer phase shift mask with an opaque layer.

2. Description of the Related Art

A photo mask is a tool for transferring patterns in the photolithography process. The main part of the mask is a flat and transparent plate composed of such materials as glass or quartz. A chrome dioxide layer, which includes the transferred patterns for defining semiconductor devices, is formed on the flat and transparent plate. The thickness of the chrome dioxide layer is in the hundreds of Å.

Currently, a phase shift mask is predominantly used in the photolithography process. It can provide better resolution for transferred patterns projected on a wafer by a projection machine. The phase shift mask has one shift layer on the conventional mask. The function of the shift layer is to generate positive and negative phase light interference when administering an exposure step in the photolithography process. Therefore, the phase shift mask can provide better resolution for transferred patterns projected on the wafer by the projection machine.

Typically, the phase shift mask has two kind of structures. One structure of the phase shift mask is a single layer phase shift mask. The other structure is a double layer phase shift mask. A process flow, showing the formation of a conventional single layer phase shift mask, is illustrated in FIGS. 1A and 1B. A process flow, showing the formation of a conventional double layer phase shift mask, is illustrated in FIG. 2A to FIG. 2E. As illustrated in FIG. 1A, a phase shift layer 102, such as chrome oxide, is formed over a transparent substrate 100, such as glass or quartz. Then, as shown in FIG. 1B, the pattern of the phase shift layer 102 is formed by exposing, developing and etching. The phase shift layer 102 including chrome oxide is a semi-transparent layer. Patterns of reticle marks or stepper marks on the mask are also semi-transparent. Although the single phase shift layer can provide better resolution for transferred patterns projected on the wafer by a projection machine, the semi-transparent reticle mark or stepper mark on the mask can easily cause registration deviation because of the high transmittance of chrome oxide. Therefore, the reticle mark or stepper mark easily causes a problem of misalignment.

Next, in FIG. 2A, a phase shift layer 202, such as MoSiON, is formed over a transparent substrate 200, such as glass or quartz. An opaque layer 204, such as chrome, is deposited on the phase shift layer. As shown in FIG. 2B, the pattern of the opaque layer 204 is defined by exposing, developing and etching. Next, in FIG. 2C, the pattern of the phase shift layer 202 is formed by a dry etching method. Then a photoresist layer 206 is painted and a pattern of the photoresist layer 206 is formed, as shown in FIG. 2D. Finally, the last pattern of the opaque layer 204 is formed by exposing, developing and etching, as shown in FIG. 2E. The conventional double layer phase shift mask is, therefore, completed.

The double layer phase shift mask is composed of a phase shift layer, such as MoSiON, and an opaque layer, such as chrome, for covering the patterns of the reticle mark or the stepper mark. Therefore, when using the double layer phase shift mask in the photolithography process, the double layer phase shift mask can provide better resolution for transferred patterns projected on the wafer. Moreover, it can avoid the registration deviation and effectively reduce the problem of misalignment of the reticle mark or the stepper mark. The method of fabricating a double layer phase shift mask includes two photolithography steps and one dry etching step, requiring frequent changes of operation machines. Therefore, the method of fabricating a double layer phase shift mask is complex and burdensome, increasing the process time and the process cost greatly.

SUMMARY OF THE INVENTION

It is therefore an object of the invention to provide a simple method of fabricating a layer phase shift mask which can provide better resolution for transferred patterns projected on the wafer.

Another object of the invention is to provide a simple method of fabricating a layer phase shift mask which can avoid the registration deviation and reduce the problem of misalignment of the reticle mark or the stepper mark efficiently by decreasing the transmittance of the reticle mark or the stepper mark.

Still another object of the invention is to provide a simple method of fabricating a layer phase shift mask without frequent changes of different operation machine. Therefore, the method of fabricating a phase shift mask can reduce the process time and the process cost greatly.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises the following steps of fabricating a phase shift mask. First, a phase shift layer is formed on a transparent substrate. Then the phase shift layer is patterned. Next, an opaque layer is deposited by a machine for repairing defects on a reticle mark or a stepper mark, both on the phase shift layer, for alignment.

BRIEF DESCRIPTION OF THE DRAWINGS

The accompanying drawings, which are incorporated in and constitute a part of this specification, illustrate one embodiment of the invention and together with the description, serve to explain the principles of the invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1A:
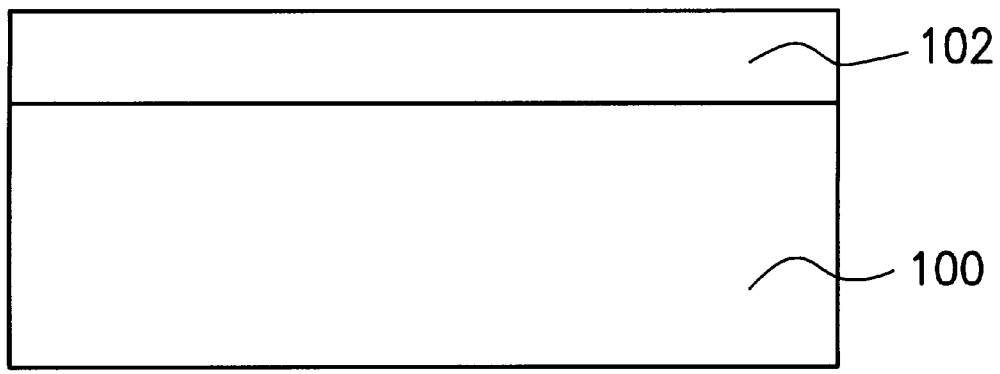
FIGS. 1A and 1B are cross-sectional views showing a conventional process flow of fabricating a single layer phase shift mask.
Figure 1B:
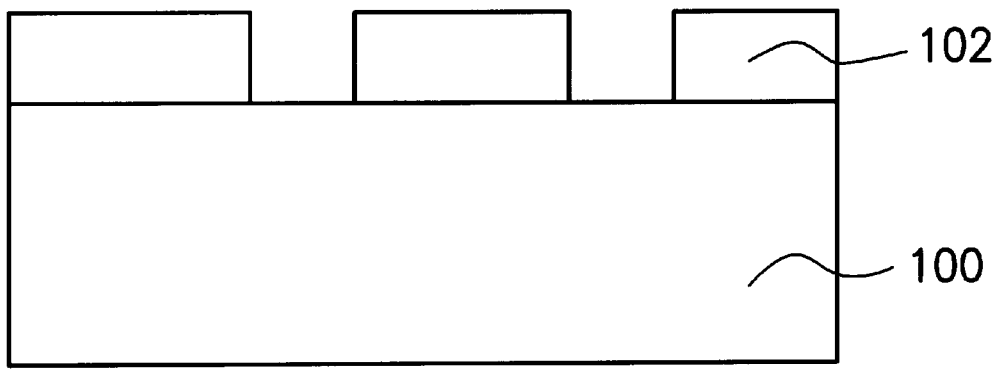
Figure 2A:
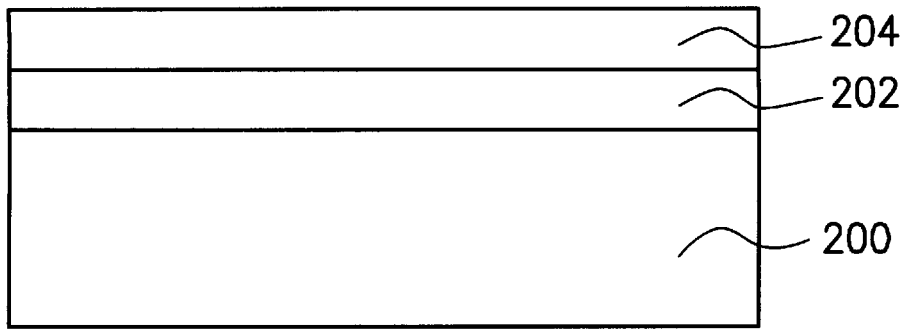
FIGS. 2A to 2E are cross-sectional views showing a conventional process flow of fabricating a double layer phase shift mask.
Figure 2B:
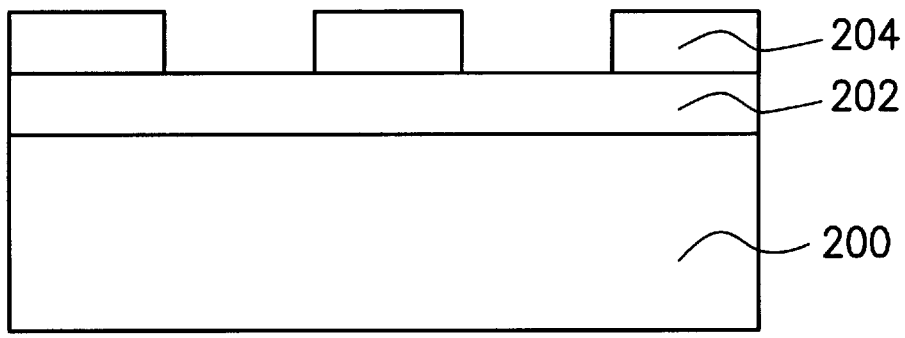
Figure 2C:
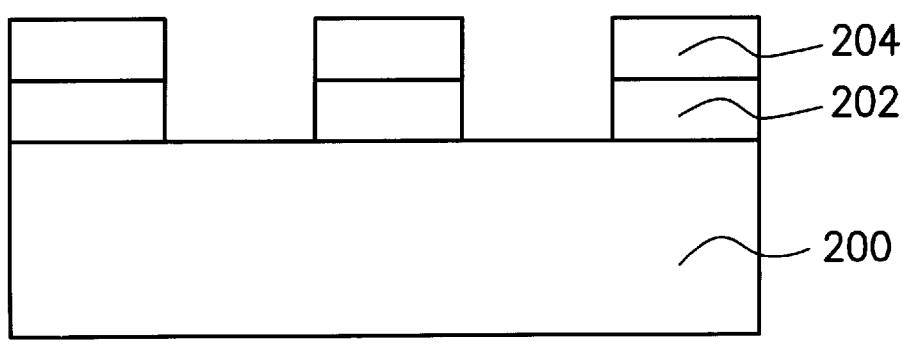
Figure 2D:
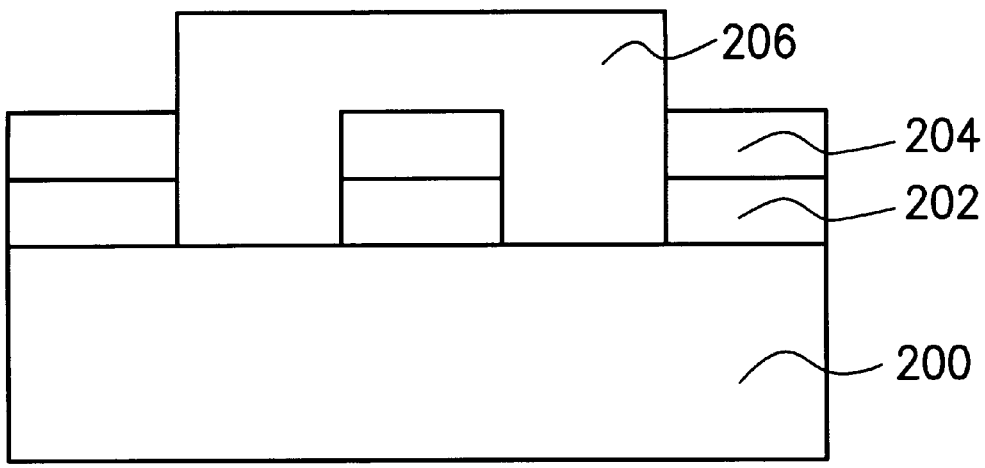
Figure 2E:
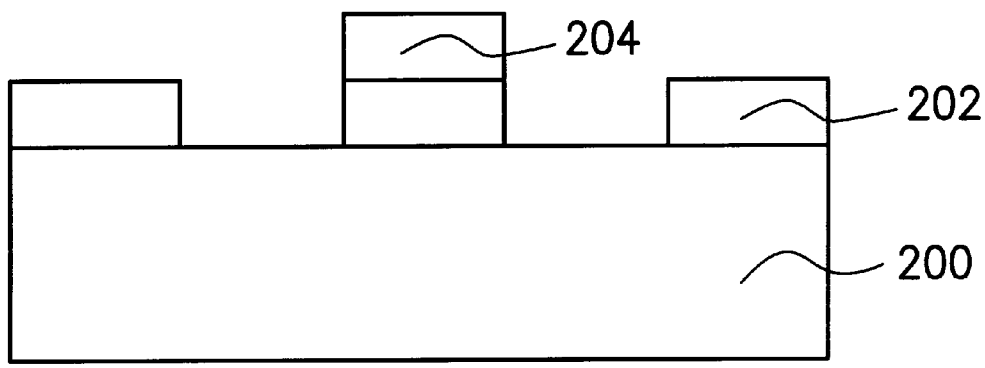
Figure 3A:
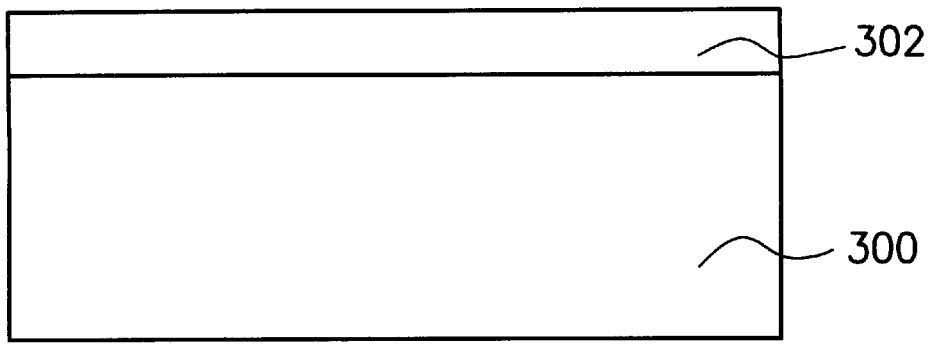
FIGS. 3A to 3C are cross-sectional views showing a process flow of fabricating a single layer phase shift mask according to a preferred embodiment of the present invention.

As illustrated in FIG. 3A, a transparent substrate 300, such as glass or quartz, is provided, and a semi-transparent phase shift layer 302, such as chrome oxide, is formed on the transparent substrate 300.

Figure 3B:
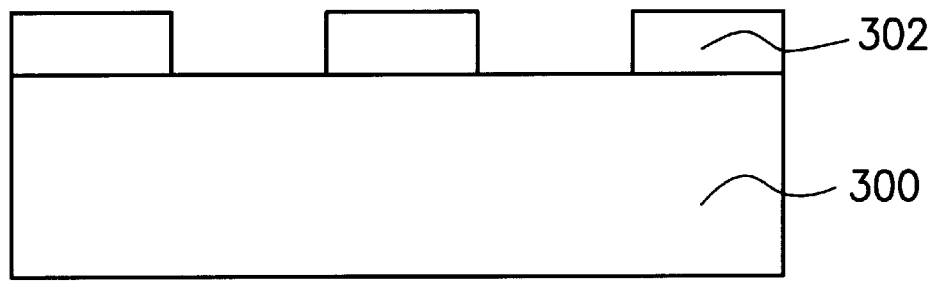

In FIG. 3B, the pattern of the phase shift layer 302 is defined. The method of patterning the phase shift layer 302 includes exposing, developing and etching.

Figure 3C:
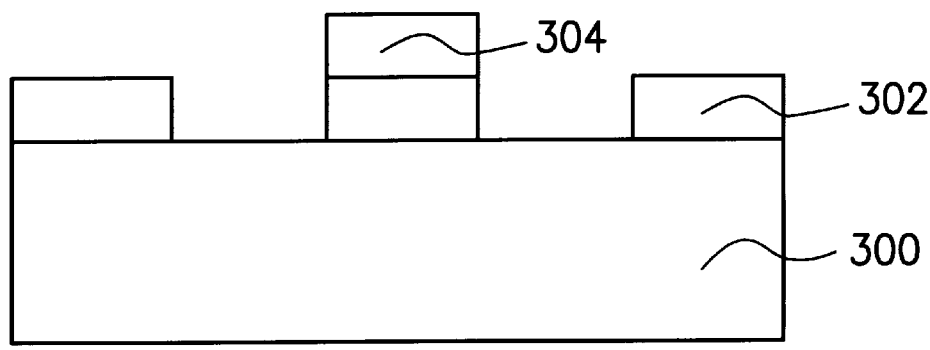

As shown in FIG. 3C, an opaque layer 304, such as carbon or gallium, is deposited by using a machine for repairing defects on a given place of the phase shift layer 302. The machine for repairing defects deposits materials on the given places. The given place of the phase shift layer 302 is a mark for alignment, such as a reticle mark or stepper mark. The single layer phase shift mask of the invention is therefore completed.

The present invention utilizes the principal of a film loss defect when repairing the single layer phase shift mask by the defect repair machine. The method of the present invention is characterized by depositing an opaque layer by using a machine for defect repair on a given place of the phase shift layer formed by a conventional method. The opaque layer is formed on a given place, such as an alignment mark. The single layer phase shift mask of the invention can provide better resolution for transferred patterns projected on the wafer, and it can avoid the registration deviation and reduce the problem of misalignment of the alignment mark efficiently by decreasing the transmittance of the alignment mark, such as a reticle mark or a stepper mark.

The single layer phase shift mask of the present invention has the following characteristics:

1. The process of the present invention is very similar to the conventional process of fabricating a single layer phase shift mask. The process of the present invention adds only one more photolithography step than the conventional process of fabricating a single layer phase shift mask. And it has less steps than the conventional process of fabricating a double layer phase shift mask. Therefore, the method of the present invention can reduce the process time and cost greatly.

2. The present invention uses the machine for defect repair. The defect repair machine for deposits materials on given places. The present invention is characterized by depositing an opaque layer by using the defect repair machine on a given place, such as the alignment mark. The alignment mark includes a reticle mark or a stepper mark. Therefore, the invention can avoid registration deviation and reduce the problem of misalignment of the alignment mark efficiently by decreasing the transmittance of the alignment mark, such as a reticle mark or a stepper mark.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a phase shift mask, comprising the steps of:

providing a transparent substrate;

forming a phase shift layer on the transparent substrate;

patterning the phase shift layer, the phase shift layer having at least one of a reticle mark and a stepper mark for alignment; and forming an opaque layer in a single step by using a defect repair machine, the opaque layer including one of carbon and gallium and being formed on the one of the reticle mark and the stepper mark in the phase shift layer.

2. The method as claimed in claim 1, wherein the transparent substrate includes glass.

3. The method as claimed in claim 1, wherein the transparent substrate includes quartz.

4. The method as claimed in claim 1, wherein the phase shift layer is semi-transparent layer.

5. The method as claimed in claim 1, wherein the phase shift layer includes chrome oxide.

6. The method as claimed in claim 1, wherein the opaque layer includes carbon.

7. The method as claimed in claim 1, wherein the opaque layer includes gallium.

8. The method as claimed in claim 1, wherein the opaque layer includes chrome.

9. The method as claimed in claim 1, wherein the defect repair machine deposits materials on the one of the reticle mark and the stepper mark.

10. A method of fabricating a phase shift mask, comprising the steps of:

providing a quartz substrate;

depositing a chrome oxide layer on the quartz substrate;

patterning the chrome oxide layer, the chrome oxide layer having at least one of a reticle mark and a stepper mark for alignment; and forming an opaque layer in a single step by using a defect repair machine, the opaque layer including one of carbon and gallium and being formed on the one of the reticle mark and the stepper mark in the phase shift layer.

11. The method as claimed in claim 10, wherein the opaque layer includes carbon.

12. The method as claimed in claim 10, wherein the opaque layer includes gallium.

13. The method as claimed in claim 10, wherein the opaque layer includes chrome.

14. The method as claimed in claim 10, wherein the defect repair machine deposits materials on the one of the reticle mark and the stepper mark.

15. The method as claimed in claim 10, wherein the chrome oxide layer is a phase shift layer.

16. A method of fabricating a phase shift mask comprising the steps of:

providing a transparent substrate;

forming a phase shift layer on the transparent substrate;

patterning the phase shift layer, the phase shift layer having at least one of a reticle mark and a stepper mark for alignment; and forming an opaque carbon layer in a single step by using a defect repair machine, the opaque carbon layer being formed on the one of the reticle mark and the stepper mark in the phase shift layer.

17. A method of fabricating a phase shift mask comprising the steps of:

providing a transparent substrate;

forming a phase shift layer on the transparent substrate;

patterning the phase shift layer, the phase shift layer having at lest one of a reticle mark and a stepper mark for alignment; and forming an opaque gallium layer in a single step by using a defect repair machine, the opaque gallium layer being formed on the one of the reticle mark and the stepper mark in the phase shift layer.

* * * * *